(12) United States Patent
Abdelsamie et al.

(10) Patent No.: US 11,994,540 B2
(45) Date of Patent: May 28, 2024

(54) CURRENT MEASURING SYSTEM

(71) Applicant: ONTARIO POWER GENERATION INC., Toronto (CA)

(72) Inventors: Ahmed Abdelsamie, Toronto (CA); Viktoras Borodinas, Toronto (CA); Brenden Jackson Bradshaw, Toronto (CA); Katarzyna Izdebska, Toronto (CA)

(73) Assignee: Ontario Power Generation Inc., Toronto (CA)

( * ) Notice: Subject to any disclaimer, the term of this patent is extended or adjusted under 35 U.S.C. 154(b) by 200 days.

(21) Appl. No.: 17/776,864

(22) PCT Filed: Nov. 13, 2020

(86) PCT No.: PCT/CA2020/051552
§ 371 (c)(1),
(2) Date: May 13, 2022

(87) PCT Pub. No.: WO2021/092697
PCT Pub. Date: May 20, 2021

(65) Prior Publication Data
US 2022/0390491 A1    Dec. 8, 2022

Related U.S. Application Data

(60) Provisional application No. 62/935,798, filed on Nov. 15, 2019.

(51) Int. Cl.
*G01R 19/00* (2006.01)
*G01R 15/20* (2006.01)

(52) U.S. Cl.
CPC ....... *G01R 19/0092* (2013.01); *G01R 15/202* (2013.01)

(58) Field of Classification Search
USPC ....................................... 324/76.11
See application file for complete search history.

(56) References Cited

U.S. PATENT DOCUMENTS

| 4,200,814 A * | 4/1980 | Tanaka ................ G06G 7/162 327/358 |
| 4,739,274 A | 4/1988 | Kimball et al. |
| 2014/0009143 A1 | 1/2014 | Blagojevic et al. |
| 2016/0202294 A1 | 7/2016 | Snoeij et al. |

OTHER PUBLICATIONS

International Search Report and Written Opinion from PCT/CA2020/051552 dated Jan. 29, 2021 (8 pages).

* cited by examiner

*Primary Examiner* — Farhana A Hoque
(74) *Attorney, Agent, or Firm* — Calfee, Halter & Griswold LLP

(57) ABSTRACT

A current measuring system for measuring current from a conductor comprises a first and second circuit and a current measurer connected to a conductor connected to a first power source. The first circuit comprises an inverting operational amplifier, which generates a first threshold signal when current flows into the first power source. The second circuit comprises a biasing circuit and a non-inverting operational amplifier, which generates the first threshold signal at the second output when current flows out of the first power source.

26 Claims, 11 Drawing Sheets

CURRENT MEASURING SYSTEM

CROSS-REFERENCE TO RELATED APPLICATIONS

This application is the 371 Application of PCT/CA2020/051552, filed Nov. 11, 2020, which claims priority from U.S. provisional patent application No. 62/935,798, entitled "CURRENT MEASUREMENT SYSTEM", filed Nov. 15, 2019, the entireties of which [is] are both hereby incorporated by reference.

FIELD OF THE DISCLOSURE

The present disclosure concerns a current measuring system, more specifically a current measurement system comprising a current measurer.

BACKGROUND

There is a growing demand for high-performance wireless sensors that can monitor the health of equipment while minimizing the invasiveness to that system. Non-invasive sensors can carry the advantage of minimizing equipment downtime, as well as ease of replacement, repair, and diagnosis. Monitoring parameters such as temperature and humidity typically provide more flexibility to design non-invasive sensors, possibly minimizing system impact. In order to measure more complex variables such as current or voltage, designers must take extra care in designing a solution that is not only accurate but also non-invasive.

Current measurement is a parameter considered in a range of applications including power factor correction techniques, line-fault detection in power distribution, and failure detection of electrically-powered industrial equipment. Current measurement sensors can be used to monitor the health of electrical systems. By trending the received data, algorithms can be created to predict failure of equipment before permanent damage to an electrical system occurs. This technique is employed across various electronic equipment.

Measuring current on an industrial scale poses two main challenges: (1) invasiveness of the measuring device to the system, and (2) the measuring devices' impact on the safety and reliability of the system. Common methods for measuring current on an industrial scale include high precision shunt resistors, current transformers, hall-effect transducers, and Rogowski coils. The shunt resistor method typically offers an accurate solution to measuring current. Although it is a widely implemented technique, it is less feasible on an industrial scale because it must be implemented in series with the existing system. Furthermore, industrial equipment sees a large range of currents from in-rush (typically >1 kA) to trickle charging (typically <1 A). This presents a challenge to the shunt resistor method to measure a system both safely and accurately.

Another method that can be used in industrial applications is a clamp-on current measurement sensor. This is a non-invasive method to carry current measurement, however these types of sensors suffer from poor linearity and reduced accuracy during charging and discharging cycles where the current is small (typically <1 A).

A drawback with current clamps is the regions of non-linearity from the saturation of the magnetic flux density. It would be desirable to provide a solution for current measurement system, particularly in industrial applications, which is non-invasive, and does not impact the safety or reliability of the system under monitoring.

SUMMARY

In some example aspects of the present disclosure, a current measurement system comprises a current measurer configured to generate an output signal upon sensing a current in a conductor connected to a first power source. The current measurer is connected to an input terminal of a first circuit and a second circuit, where the first circuit and the second circuit comprise a first input and a second input connected to the input terminal, and a first output and a second output, respectively. The first output indicates, based on the first input, that the first power source is charging energy. The second output indicates, based on the second input, that the first power source is discharging energy. A controller is connected to the first output and the second output, and the controller being configured to determine a first threshold signal, the first threshold signal being whichever one of the first or the second output signal that is above a first threshold, and linearize the first threshold signal.

In any of the above examples, the current measurement system may linearize the first threshold signal by applying one or more first order equations to the first threshold signal.

In any of the above examples, the current measurer may be connected to a boost converter, with the boost converter being connected to the first power source and configured to power the current measurer.

In any of the above examples, the first and second circuit may be configured as follows: the second circuit is configured to generate the first threshold signal to a second output in response to the input signal indicating that the first power source is discharging energy, and the first circuit may be configured to generate the first threshold signal to a first output in response to the input signal indicating that the first power source is charging energy.

In any of the above examples, the first circuit may comprise an inverting operational amplifier (op amp) connected to an upper supply rail and a lower supply rail, the lower supply rail being supplied at a non-negative voltage, and the op amp being connected to the first output.

In any of the above examples, the second circuit may comprise a biasing circuit connected to the second input and a non-inverting op amp. The non-inverting op amp can be connected to a second upper supply rail and a second lower supply rail, the second lower supply rail being supplied at a non-negative reference voltage, the non-inverting op amp being connected to the second output.

In any of the above examples, the reference voltage may be supplied by a third circuit comprising a voltage regulator configured to step down the reference voltage to the output signal.

In any of the above examples, the biasing circuit may include a linear regulator system configured to provide the reference voltage.

In any of the above examples, the controller may be configured to process the first threshold signal into a digital output.

In any of the above examples, the current measurer may be configured to harvest energy to power the current measuring system when measuring AC current.

In any of the above examples, the controller may have an interface to receive commands from a remote system.

In any of the above examples, the controller may have an interface to receive commands from a local system.

In any of the above examples, the current measurer may be connected to a boost converter, the boost converter being connected to a second power source and configured to power the current measurer.

In any of the above examples, the controller may be connected to the first power source.

In any of the above examples, the controller and first power source may be connected to a coulomb counter configured to measure the capacity of the first power source.

In any of the above examples, the controller may be a non-floating point controller configured to emulate and carry floating point measurements.

In any of the above examples, the first signal threshold may be zero or substantially zero, and the current measurer may be a current measurer comprising a hall effect transducer.

In some example aspects of the present disclosure, a method of operating the current measurement system, described above, is provided. In particular, a method is provided of operating the current measurement system in which: the second circuit is configured to generate the first threshold signal to a second output in response to the input signal indicating that the first power source is discharging energy; the first circuit configured to generate the first threshold signal to a first output in response to the input signal indicating that the first power source is charging energy; the first circuit includes an inverting operational amplifier (op amp) connected to an upper supply rail and a lower supply rail, the lower supply rail being supplied at a non-negative voltage, and the op amp being connected to the first output; and the second circuit includes a biasing circuit connected to the second input and a non-inverting op amp, and the non-inverting op amp being connected to a second upper supply rail and a second lower supply rail, the second lower supply rail being supplied at a non-negative reference voltage, the non-inverting op amp being connected to the second output. The method includes: determining, by a controller, which is coupled to receive the first and second output signals, that voltages of the first and second output signals are each within a first threshold. The controller determines that the upper supply rail and the lower supply rail are each within a second threshold. The controller also determines that the second upper supply rail and the second lower supply rail are each within the second threshold. The controller processes the first and second output signals into the controller, and determines a first threshold signal, the first threshold signal being whichever one of the first or second output signal that is above a first threshold. The controller linearizes the first threshold signal, and converts the linearized first threshold signal into a digital output. A data packet is generated containing the digital output.

In any of the above examples, the method may further comprise linearizing by processing the first threshold signal using first order equations to reduce any non-linearity in the signal.

In any of the above examples, the method may further comprise sending the data packet over a communication protocol to a remote device.

In any of the above examples, the controller may be configured to enable operation of the current measurement system at a pre-determined interval.

In any of the above examples, the controller may be configured to enable operation of the current measurement system in response to a remote system signal.

In any of the above examples, the method may further comprise sending an error signal in response to determining that at least one of the first and second output signals is outside of the first threshold.

In any of the above examples, the method may comprise sending an error signal in response to determining at least one of the upper supply rail, the second upper supply rail, the lower supply rail, or the second lower supply rail is outside the second threshold.

In any of the above examples, the method may comprise entering the current measurement system into a sleep mode after generating the data packet.

In any of the above examples, the first threshold may be zero or substantially zero.

BRIEF DESCRIPTION OF THE DRAWINGS

Reference is made below to the accompanying drawings in which.

DESCRIPTION

Reference is made below to one or more particular examples which are not intended to be limiting on the scope of the disclosure.

In the measurement of current on the standby power systems at a nuclear power plant, measuring current presents a unique challenge. Using lead acid or nickel-cadmium (Ni-Cad) batteries, these standby power systems are designed to provide uninterruptable power to equipment such as instrumentation and control systems, and starter motors. Due to the nature of the loads, the current required to be measured during the in-rush and steady state operation typically varies widely. This presents a design constraint for current measurement, and a solution such as a shunt resistor would introduce too much impedance into the system during high in-rush currents, creating excessive heat dissipation, and voltage sag.

The use of a clamp-on current meter provides sensor designers with a non-invasive solution in comparison to other measuring techniques such as shunt resistors or current transformers.

A system described herein illustrates an example arrangement in which post-signal processing in the digital domain (e.g., using a controller such as a low-power microcontroller unit (MCU)) may help to address one or more of the design constraints presented by a clamp-on measurement device.

An example embodiment includes a design and method for accurately measuring current through the use of a current measurer such as a current clamp. The current measurer, in example embodiments, comprises a hall-effect transducer. The example design may be able to measure a wide range of current values while reducing power consumption and maintaining accuracy using active error correction techniques.

Figure 1:
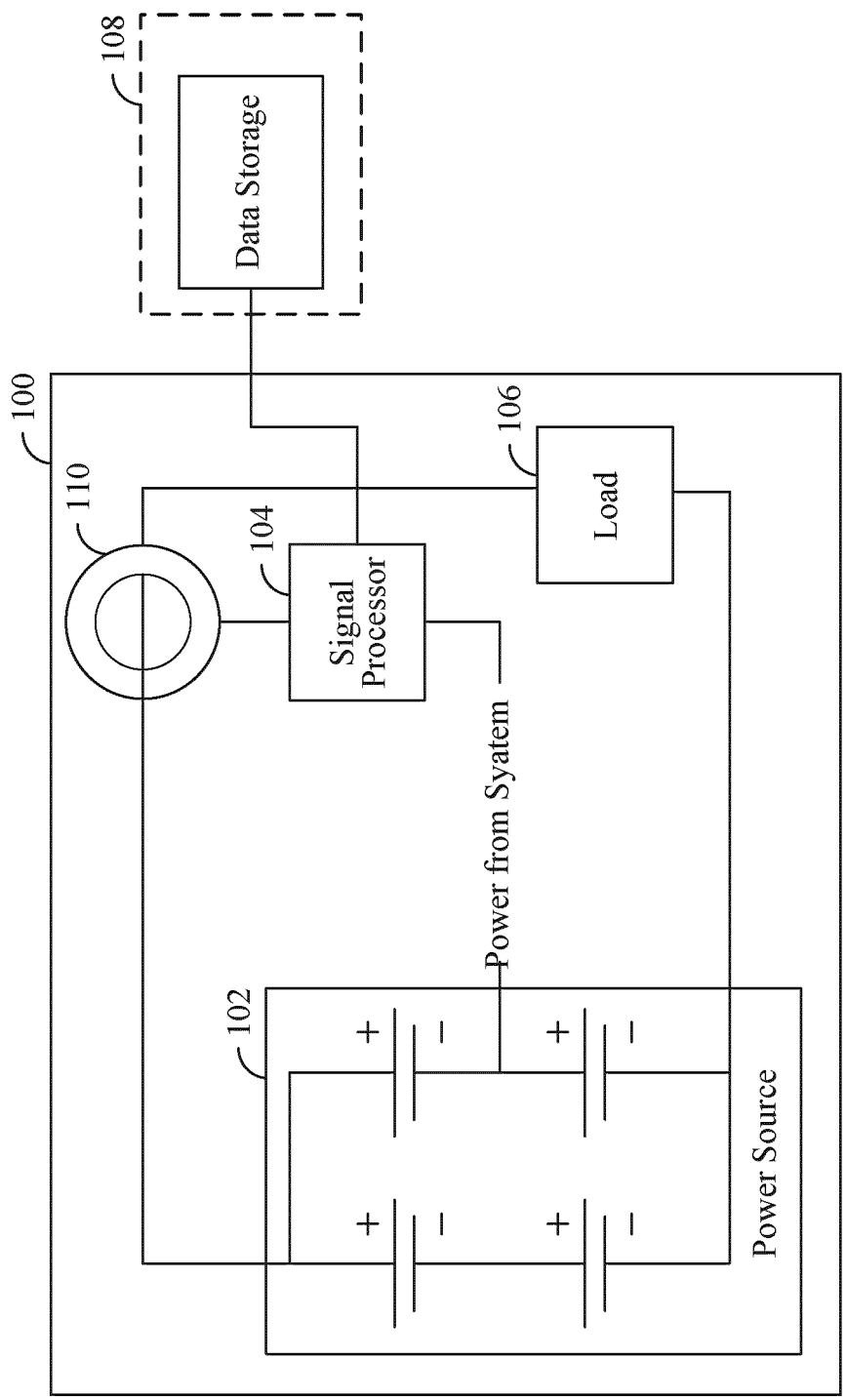
FIG. 1 illustrates an example current measurement system comprising a current measurer attached to a conductor connected to a first power source.

FIG. 1 illustrates a simplified diagram of an example non-invasive current measurement system 100. The current measurement system 100 comprises a signal processor 104 and a current measurer 110. The current measurer 110 may be mounted or installed upon a conductor (also referred to as a connection) between a load 106 and a first power source 102. The current measurer 110 may generate a voltage signal (or more generally an output signal) upon sensing a current in the conductor (e.g., in response to magnetic flux generated by the conductor). The current measurer 110 can include a hall-effect transducer for measuring the magnetic flux. In the example embodiment shown in FIG. 1, the current measurer 110 and signal processor 104 are powered by the first power source 102 which also provides power to the load 106. The current measurer 110 and signal processor 104 may be powered by the power source (e.g., the first power source 102) that the current measurer 110 is monitoring, which may eliminate the need for an external (or second) power supply.

The current measurer 110 in example embodiments is a current clamp comprising a hall effect transducer. In some embodiments, the current measurer 110 is a semi-conducting device, similar to a shunt resistor, capable of generating an output signal (e.g., an output voltage) in response to sensing a magnetic field. Any other component, capable of generating an output signal based on sensing a current in the conductor, may be used as the current measurer 110.

In example embodiments, the current measurer 110 and signal processor 104 are powered by an external power source (not shown).

In example embodiments, data storage 108 can be used with the current measurement system 100 to store historical monitoring data of the power source being monitored (e.g., shown in FIG. 1 as the first power source 102). Data storage 108 may be internal to the current measurement system 100, or, as shown in the example embodiment in FIG. 1, the data storage 108 can be external to the current measurement system 100.

In example embodiments, current measurer 110 is powered by a voltage, referred to hereinafter as ($V_{CLAMP}$). The output signal generated by the current measurer 110 can be accomplished, in example embodiments, via a hall effect transducer. The hall effect transducer may be configured (e.g., through hardware), to provide an analog output within a range (in this example, an analog output voltage in the range of about −5V to about +5V). These voltage readings are used to measure bidirectional (i.e., charge and discharge) current to or from power source 102. However, different design requirements for current measurers 110 with different supply requirements and output ranges can be used to measure the current in a conductor. For example, a variety of different hall effect transducers can be incorporated into the current measurer 110.

Figure 2:
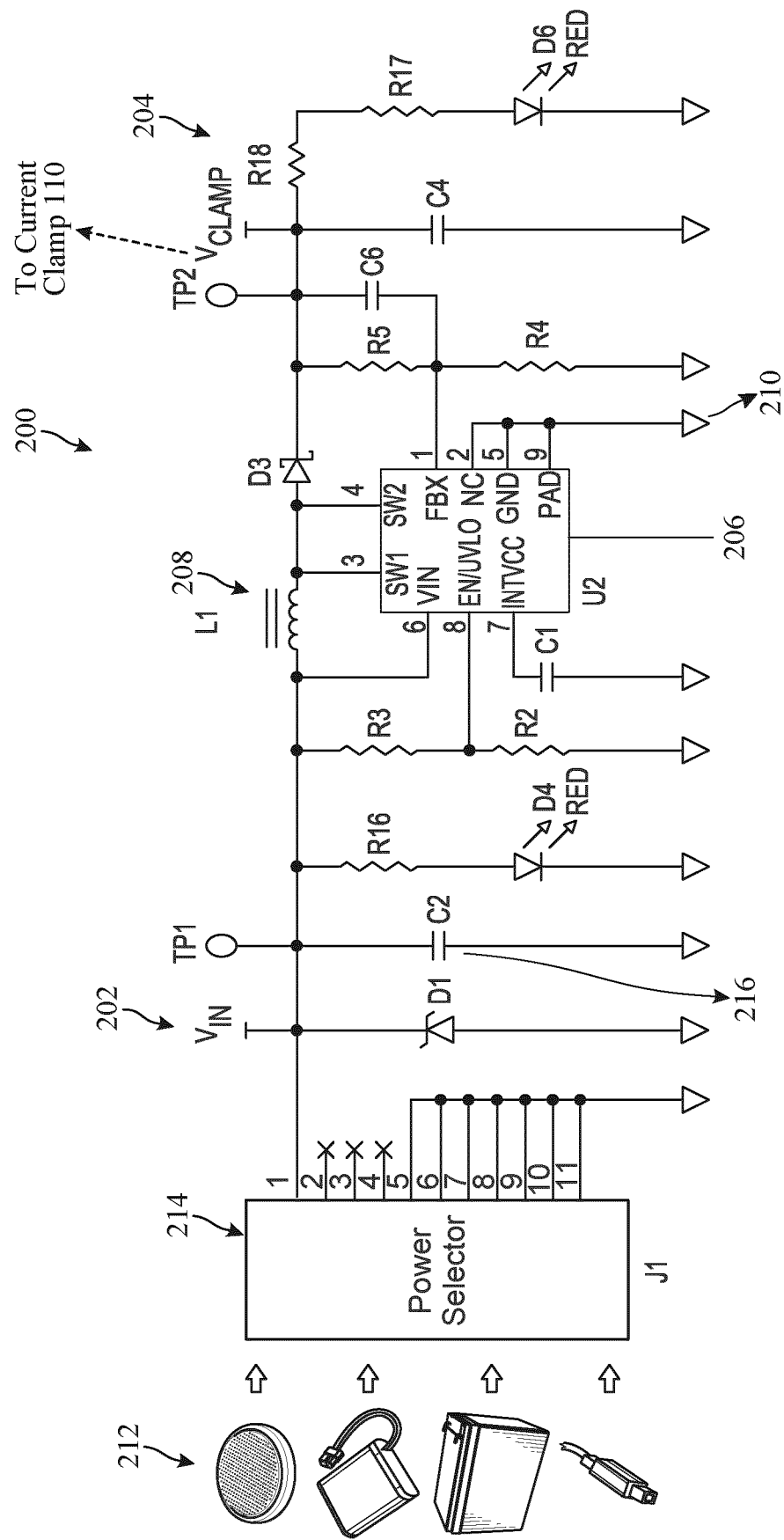
FIG. 2 illustrates an example boost converter circuit that may be used to power a current measurer.

Referring now to FIG. 2, boost converter 200 may be used to supply current measurer 110 within the current measurement system 100 with a required voltage level 204, denoted by the DC power input $V_{CLAMP}$. In an example embodiment, a DC to DC converter may be the boost converter used to power the current measurer 110.

DC-DC converters or switching regulators may be an efficient means to convert one DC voltage (an input voltage) to another desired DC voltage in electronic applications that require a stable power supply potential. Referring to FIG. 2, the boost converter 200 is a DC to DC power converter that has an input power voltage 202 ($V_{in}$), which is supplied by one or more power sources 212.

Input power voltage 202 may have a voltage level either lower than or higher than the required voltage level 204 (shown as $V_{CLAMP}$). The desired average DC output voltage for the required voltage level 204 may be predefined according to the power needs of the circuit (e.g., the current measurement system 100) to which the boost converter 200 is connected. Switching regulator 206 indirectly regulates the average DC output voltage of the required voltage level 204, by switching energy on and off in inductor 208. By comparing the required voltage level 204 to reference 210, the current flowing through inductor 208 can be controlled to provide the desired required voltage level 204.

The boost converter 200 can be supplied from a variety of power sources 212. In an example embodiment, multiple power sources 212 are available and a power selector 214 is used to manage the power sources 212. The power sources 212 may include, for example, a coin cell battery, lithium battery, USB power source, or the power source being monitored by the current measurement system 100 (e.g., lead acid battery, Ni-Cad battery, lithium battery, etc.).

In example embodiments, there may be only one power source 212 to supply the boost converter 200, and the power selector 214 is not utilized or may be omitted.

Capacitor 216 can be used as a reservoir capacitor, to filter noise as a result of variations in voltage as the current measurer 110 powers on and powers off.

Figure 3:
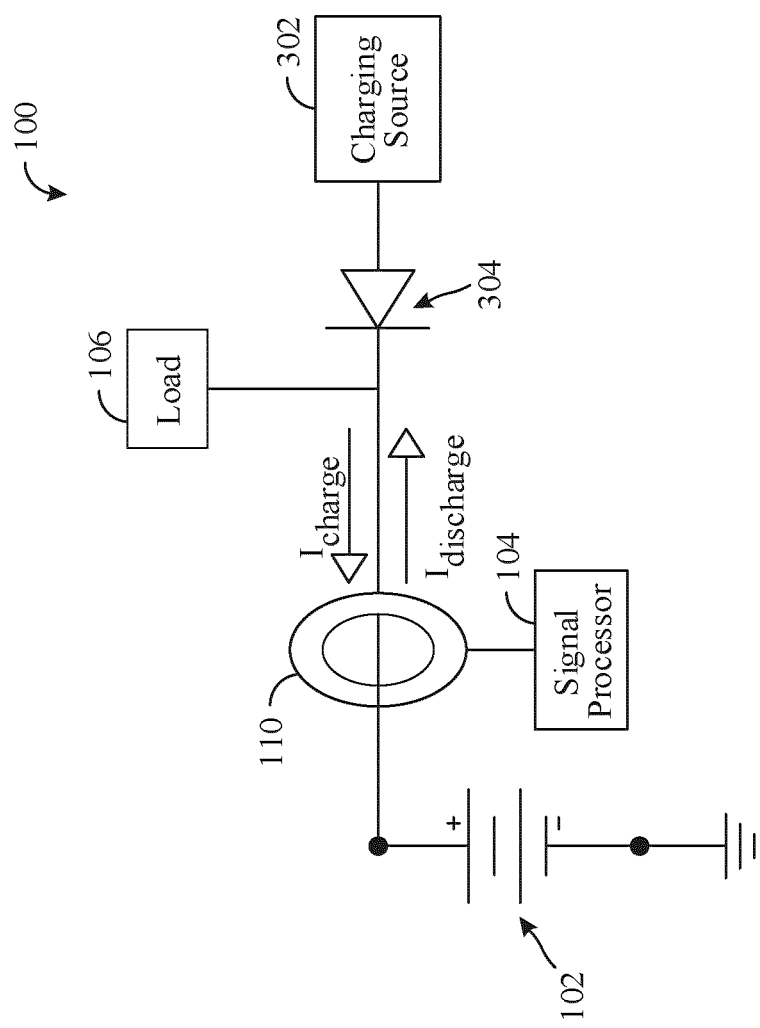
FIG. 3 illustrates an example of a current measurer configuration during the first power source charging and discharging cycle.

FIG. 3 illustrates an example embodiment of the current measurement system 100 wherein the current measurer 110 is connected to a conductor between the first power source 102, load 106 and a charging power source 302.

In this configuration, the current measurer 110 is able to provide an analog output signal during the charging of power source 102, wherein charge flows from charging power source 302 to power source 102, as indicated via $I_{charge}$. The current measurer 110 also provides an output signal when the power source is discharging into load 106, shown by $I_{discharge}$.

In the example embodiment, diode 304 prevents charge from flowing from the power source 102 to the charging power source 302. In other example embodiments, an electrical element with the functionality of a diode may be built into the charging power source 302, in which case the diode 304 may be omitted.

Depending on the magnitude and direction of the current flowing through the connection between power source 102, load 106, and charging power source 302, a magnetic field is generated. The magnetic field generated by the moving current causes the current measurer 110 to produce an output signal 432, as described below in respect of FIG. 4, also referred to as $V_{out}$. In example embodiments, the hall effect transducer located within or on the current measurer 110 produces the output signal in response to the magnetic field. The output signal 432 from the current measurer 110 varies depending on whether the current direction is from the charging power source 302 to the power source 102 (charging) or from the power source 102 to the load 106 (discharging).

In an example embodiment, during the charging cycle, the output signal 432 from the current measurer 110 may be in the range of +5 v≥output signal 432≥0V. During the discharging cycle, the output signal 432 from the current measurer 110 may be in the range of 0V≥output signal 432≥−5V. The polarity of the output signal 432 is dependent on the orientation of the current measurer 110.

To accurately measure the charging and discharging current from the power source 102 under monitoring, the output signal 432 may be split into two separate analog signals to represent the charging (CHG_OUT) and discharging (DSG_OUT) cycles by signal processor 104.

Within signal processor 104, the split signals described above may be sent to and processed by a controller, an example of which is a microcontroller unit (MCU).

Figure 4:
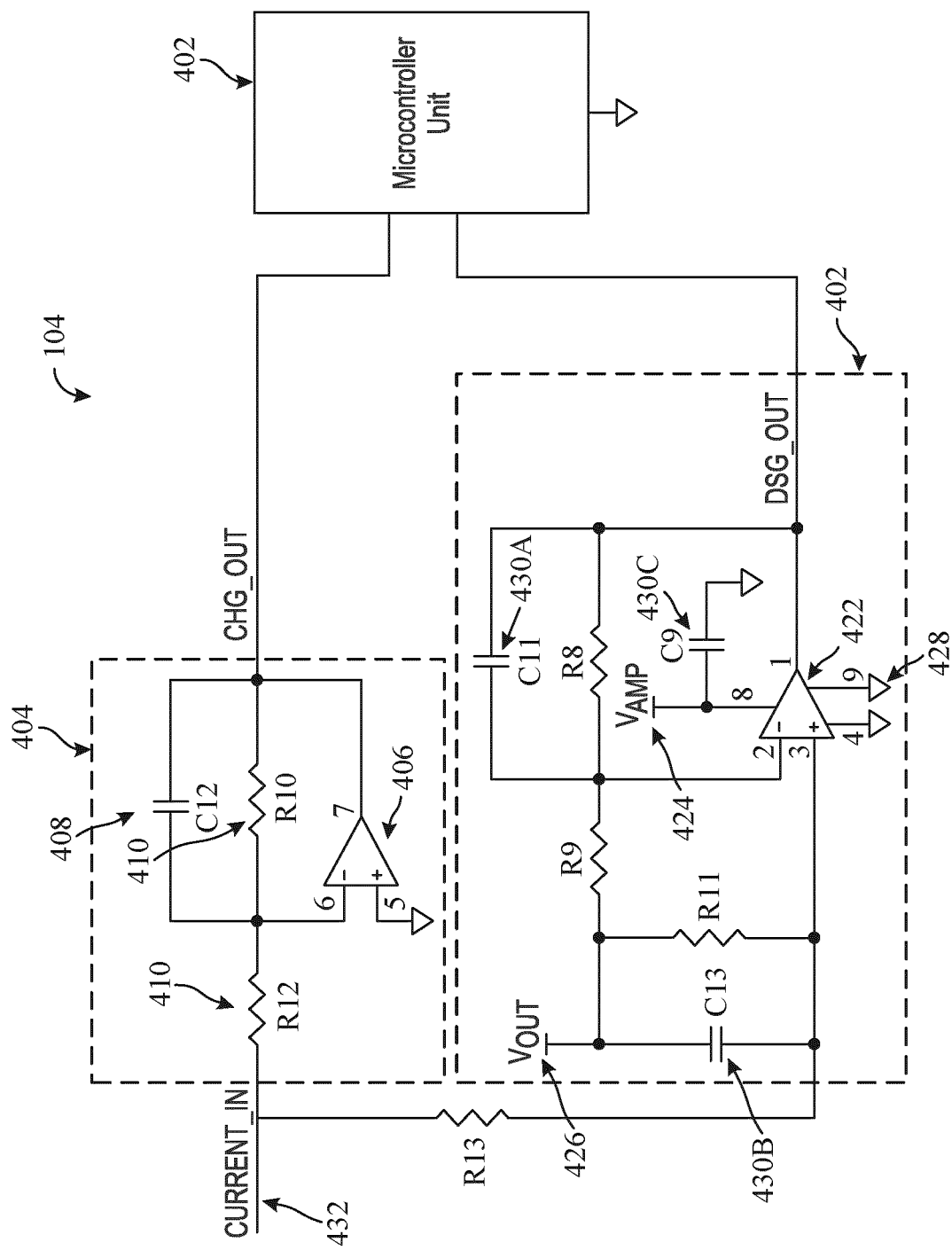
FIG. 4 illustrates examples of a first and a second circuit which separates the analog output of a current measurer into a first and a second output.

Referring now to FIG. 4, an example embodiment of signal processor 104 is shown which separates the signals into the charging and discharging cycles, as described above.

Signal processor 104 operates by cutting off a portion of the current measurer 110 output signal by relying on operational amplifiers to cut off signals outside the supply voltage rails. The example signal processor 104 includes a first circuit (in the example shown, a charge out circuit) 404 and a second circuit (in the example shown, a discharge out circuit) 420, which are described in detail below.

Referring to the first circuit 404, an input terminal (which is connected to the current measurer 110) carries the output signal 432 from the current measurer 110 as an input signal into the first circuit 404. The input signal is inverted using inverting operational amplifier (op amp) 406. The inverting operational amplifier 406 is connected to an upper supply rail and a lower supply rail. In the example embodiment, inverting operational amplifier 406 has a negative upper supply rail and non-negative lower supply rail (not shown) cutting off the negative element of the input signal due to the inverting operational amplifier 406's inability to reproduce an output below the negative supply rail. Accordingly, the first output signal provided by the first circuit 404 indicates whether the first power source 102 is charging energy. In example embodiments, the supply rails of the inverting operational amplifier 406 may be used to control the allowable range of the first output signal carried by the first output. Resistors 410 can be used to determine the amount of gain generated by the inverting operational amplifier 406. The first output signal is the result of the input signal having been processed by the first circuit 404. Capacitor 408 may be used to filter noise and correct error within first circuit 404, which may include variations in voltage as the system powers on and off.

The second circuit 420 also is connected to the current measurer 110 via the input terminal, to receive an input signal into the second circuit 420. The second circuit 420 is used to process the input signal into a second output signal, shown as "DSG_OUT". The second output signal indicates whether the first power source 102 is discharging energy. Second circuit 420 comprises a non-inverting operational amplifier 422, with a positive second upper supply rail 424 and non-negative second lower supply rail 428. In example embodiments, operational amplifier 422 is further biased with a biasing voltage 426, which may be the $V_{OUT}$ from the regulator circuit 600. As a result, where the $V_{OUT}$ signal from current measurer 110 is a negative voltage, operational amplifier 422 will produce a zero voltage output signal as the negative signal would be outside the supply rails. In an example embodiment, operational amplifier may be configured with a ground supply rail and a non-negative second lower supply rail 428. Thus, similar to the operation of first circuit 404, the first output signal is cut off in the second circuit 420.

In example embodiments, capacitors 430 may be utilized in order to reduce noise and/or error from the biasing voltage 426 and/or second upper supply rail 424, to provide stability to null high frequency oscillations, and for AC decoupling. In the example embodiment shown in FIG. 4, capacitor 430A provides stability to null high frequency oscillations, capacitor 430B provides noise filtering, and capacitor 430C provides noise filtering and AC decoupling. Similar to first circuit 404, capacitors 430 may also be used for the purposes set out above within the second circuit 420.

In the example embodiment shown, the CHG_OUT and DSG_OUT signals (i.e., the first and second outputs) are received by a controller 402, for example the microcontroller unit shown in FIG. 4.

Figure 5:
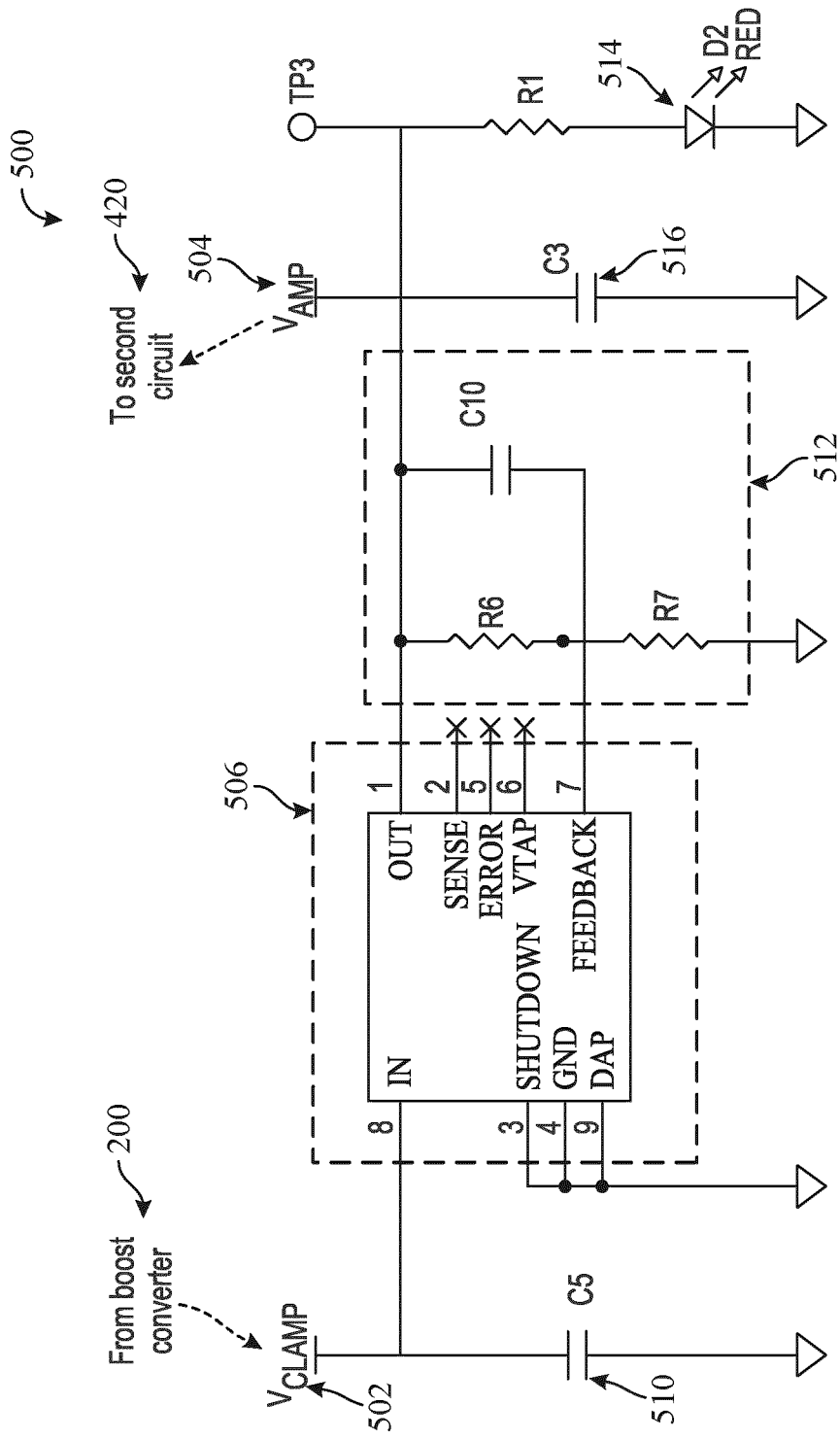
FIG. 5 illustrates example circuitry to power an operational amplifier.

In example embodiments, second upper supply rail 424 may comprise a third circuit which may be the voltage regulator circuit 500 in FIG. 5, which is configured to receive power from the input voltage 502 and provide an output voltage 504. Voltage regulator circuit 500 may be a step up converter when used where the output signal from the current measurer 110 is lower than the desired voltage to positive supply rail 424. In example embodiments, voltage regulator circuit 500 may be a step down converter where the input voltage 502 is higher than output voltage 504 required by the desired voltage to positive supply rail 424.

In the shown embodiment, voltage regulator circuit 500 comprises a step down converter 506 connected to an input voltage 502, denoted as $V_{CLAMP}$, connected to a capacitor 510 to reduce noise and/or error. In example embodiments, the input voltage 502 is the same as required voltage level 204 supplied by boost converter 200. In the shown embodiment, step down converter 506 comprises a feedback terminal, intended to monitor the voltage output by step down converter 506, provided by feedback circuit 512, and adjust the output voltage accordingly.

In example embodiments, capacitor 516 is connected in parallel to output voltage 504, denoted by $V_{AMP}$, to reduce noise in the output voltage $V_{AMP}$ 504. In example embodiments, light-emitting diode 514 is connected to the output circuit and can provide a visual indicator as to whether the voltage regulator circuit 500 is receiving power.

The output voltage $V_{AMP}$ 504 from step down converter 506 is provided back to the second circuit 420 at second upper supply rail 424. The output voltage $V_{AMP}$ 504 can be adjusted via selecting of an appropriate voltage regulator circuit 500 and input voltage 502 to achieve a desired voltage.

Figure 6:
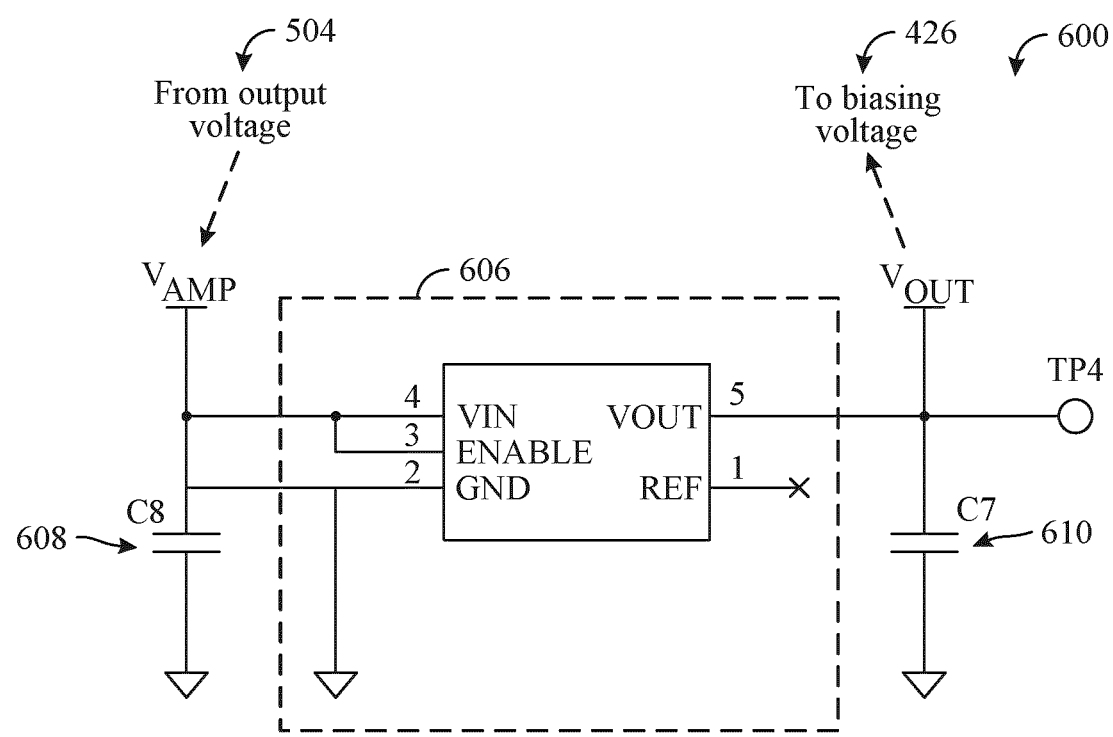
FIG. 6 illustrates example circuitry for providing an operational amplifier voltage reference.

In example embodiments, the biasing voltage 426 may be provided by a linear regulator system. Referring now to FIG. 6, an example linear regulator system 600 which is a low dropout regulator is shown. In the example embodiment, linear regulator system 600 uses output voltage 504 as an input voltage, denoted by $V_{AMP}$. Linear regulator 606 is capable of maintaining a steady voltage output as biasing voltage 426, denoted by $V_{OUT}$. The linear regulator 606 may be chosen with an appropriate dropout voltage depending on the expected variations between the output voltage 504 and the biasing voltage 426.

In example embodiments, capacitors 608 and 610 are used to reduce noise and/or error within the regulator system.

For reference, in the shown example embodiment in FIG. 4, the current measurement system 100 of FIG. 1 comprises a current measurer 110 which generates an output signal upon sensing a current in a conductor connected to a first power source 102. The current measurer 110 is connected to an input terminal 432 of a signal processor 104 (shown in FIG. 4), comprising a first circuit 404 and a second circuit 420, where the first circuit 404 and the second circuit 420 comprise a first input and a second input connected to the input terminal 432, and a first output and a second output, respectively. The first output indicates, based on the first input, that the first power source 102 is charging energy. The second output indicates, based on the second input, that the first power source 102 is discharging energy. A controller 402 is connected to the first output and the second output, and the controller 402 determines a first threshold signal, which is determined by determining which of the first or second output signal is above a first signal threshold. The first threshold signal is whichever one of the first or second output signal is above the first signal threshold. The controller 402 then linearizes the first threshold signal (e.g., using one or more suitable first order equations).

The first signal threshold may be zero (or close to zero). Thus, determining the first threshold signal may include determining which of the first and second output signals are non-zero, or substantially non-zero (e.g., equivalent to zero within error tolerance). For example, when the first power source 102 is charging energy, the first output signal from the first circuit 404 will be non-zero (and the second output signal from the second circuit 420 will be zero or close to zero), and the first threshold signal is the first output signal from the first circuit 404. Conversely, when the first power source 102 is discharging energy, the second output signal from the second circuit 420 will be non-zero (and the first output signal from the first circuit 404 will be zero or close to zero), and the first threshold signal is the second output signal from the second circuit 420. In example embodiments, the first signal threshold is used to delineate between signal and noise. For example, due to the sensitivity of the measuring instruments, such as the current measurer 110, the output signals can include some noise, which may require adjusting the first signal threshold. The first signal threshold may be configured to delineate other than on the basis of non-zero signals. For example, where a current measurer 110 or current measurement system 100 includes a bias, the first signal threshold may be adjusted accordingly to take into account the bias.

Figure 7:
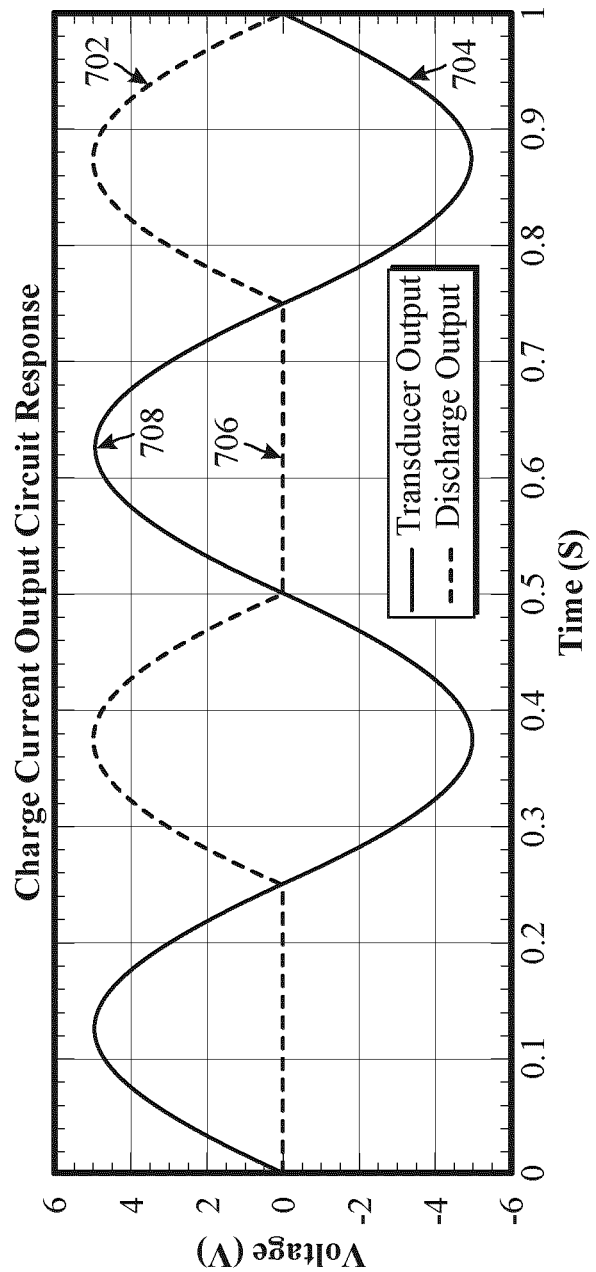
FIG. 7 illustrates an example circuit response of an example first circuit during first power source charge and discharge cycles.

FIG. 7 shows a chart that illustrates timing diagrams simulating voltage responses at the controller 402 after passing through the first circuit 404 of signal processor 104 described above, where the current is flowing into the first power source 102 (i.e., during charging of the first power source 102). In FIG. 7, the current measurer 110 output signal (labelled as transducer output) is shown along with the first output signal (labelled as charge output) from the first circuit 404. The charging cycle (current direction from charging source 302 to the first power source 102) is shown on the chart where the current measurer 110 output signal is positive (indicated by arrow 708). The charging cycle correlates to a negative current measurer 110 output signal, and corresponds to a first output signal of about 0V, as indicated by arrow 706. Where the current measurer 110 output signal is negative (indicated by arrow 704), the first output signal is between 0≤first output signal≤+5V (indicated by arrow 702), matching the current measurer 110 output signal.

Figure 8:
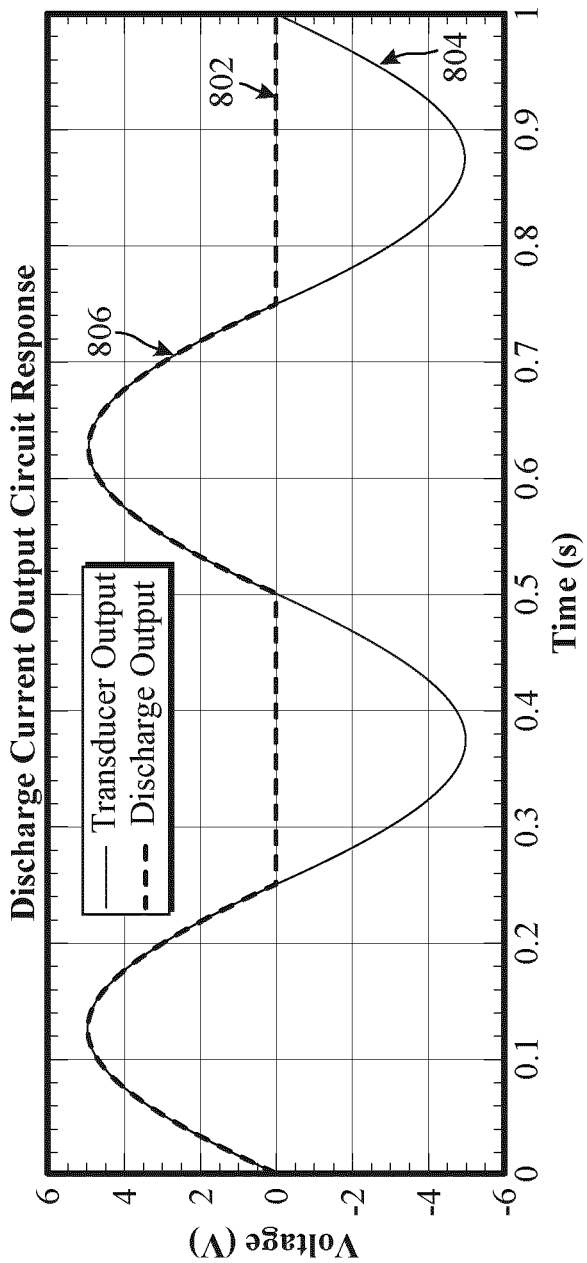
FIG. 8 illustrates an example circuit response of an example second circuit during first power source charge and discharge cycles.

Similarly, FIG. 8 shows a chart illustrates timing diagrams simulating voltage responses at the controller 402 after passing through the second circuit 420 of the signal processor 104 according to the present disclosure where the power source 102 is being discharged. In FIG. 8, the current measurer 110 output signal (labelled as transducer output) is shown along with the second output signal (labelled as discharge output) from the second circuit 420. During the discharge cycle (current direction is from the power source 102 to the load 106), when the current measurer 110 produces output voltage on 432 of about 0V to about −5V (indicated by arrow 804), a second output signal of about 0V is generated, indicated by arrow 802. Where the current measurer 110 output signal is positive (indicated by arrow 806), the second output signal is between 0≤second output signal≤+5V, matching the current measurer 110 output signal.

Figure 9:
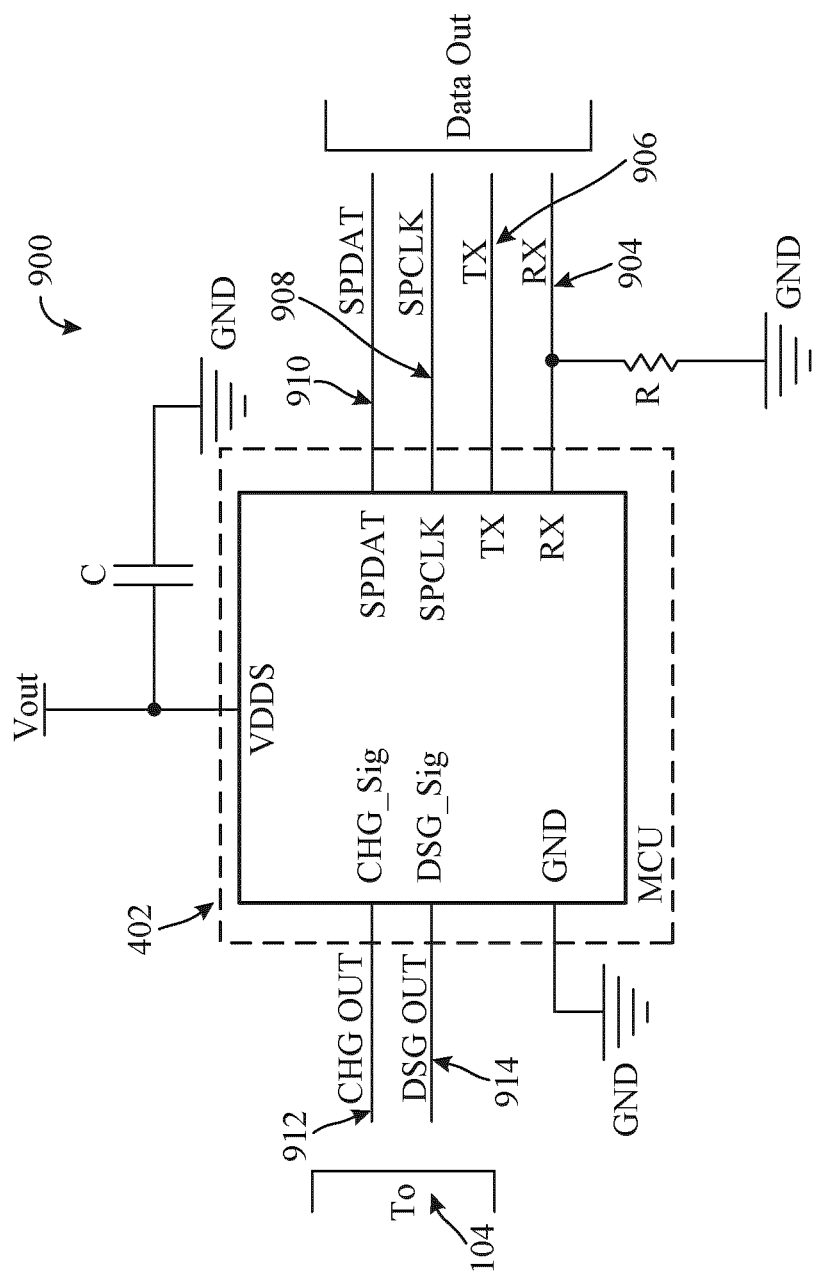
FIG. 9 illustrates an example of the interconnectivity between an example current measurement system and a microcontroller unit.

FIG. 9 shows an example processing circuit 900 which is a possible configuration of controller 402. Controller 402, such as the MCU shown in FIG. 9, is provided with the first and second output signals (shown as CHG_OUT signal 912 and DSG_OUT signal 914) from the first circuit 404 and the second circuit 420, respectively. In an example embodiment, signal processor 104 comprises the processing circuit 900. In the example embodiment, the controller 402 is connected according to a polling mechanism using the RS232 standard. The controller 402 may be configured to activate the current measurer 110 via a connection to the boost converter 200 (not shown), and take a current reading based on the first and second output signals generated by the first circuit 404 and the second circuit 420. In an example embodiment, the controller 402 may take a current reading upon receiving a signal from a communication line 904. In example embodiments, communication line 904 is connected to a remote system capable of communicating with the controller 402. The remote system may be a remote computer system. In example embodiments, controller 402 may activate the boost converter 200 for a predetermined period, thus activating the current measurer 110, and process a digital signal equivalent to the measured analog signal on the two separate pins that represent the first output signal (CHG_OUT signal 912) and the second output signal (DSG_OUT signal 914). The first and second output signals may be based on the orientation of the current measurer 110, wherein the orientation of the current measurer 110 determines which direction of current flow produces a positive output signal from the current measurer 110. In example embodiments, the controller 402 is capable of correcting for inverted current measurer 110 placement. In the example embodiment shown, the communication line 904 is connected to a remote device via an interface (not shown), which provides RX commands to trigger the controller 902 into action. The controller 902 may be configured to have a communication line that sends a signal that data is about to be sent, such as communication line 906. Communication lines 904 and 906 may be used to send the digitized signal readings (e.g., digitized signal generated by digitizing the first and second outputs of the first circuit 404 and the second circuit 420, described below) to a remote system via an interface, and communication line 914 may send timing data allowing the remote system (not shown) to synchronize the received data sent along communication lines 904 and 906.

In example embodiments, the communication lines 904 and 906 may be connected to a local system (not shown) via an interface to send the processed signal. The local system may include a processor, and may be local to the current measurement system 100 (e.g., located on-site with the current measurement system 100). The processor may contain timing information with pre-determined intervals for taking current readings.

In example embodiments, the digital signal sent via communication lines 904 and 906 may be a digital serial measured value serialized either on a fixed interval basis or based on a polling mechanism using RS232, as an example.

In example embodiments, a polling scheme is used for the first output signal (CHG_OUT signal 912) and the second output signal (DSG_OUT signal 914) pins configured to: (A) interrogate the current measurer 110 by enabling the current measurement as shown before and (B) formulate a digital response using a serial data transfer method for the measured values of the current measurer 110. The signal may be sent back using an available communication line to the remote system, as long as the remote system is configured to understand the data received from said communication line.

The controller 402 does not have to support RS232. In example embodiments, a bit bang approach, which does not require an MCU with huge processing capability, may be used to mimic the behaviour of an RS232 system. A bit bang approach may be adequate and accurate as a cost effective solution, and in an example embodiment this approach may be used for low bode rate applications.

In example embodiments, the controller 402 is configured with a predetermined measurement interval. For example, the predetermined measurement interval may be set to be frequent enough for accurate battery capacity measurement, while minimizing the amount of time the current measurement system 100 remains powered. By powering the current measurement system 100 only for the duration of the current measurement, this arrangement may help to reduce the power consumption of the current measurement system 100, and help to prolong the life of an external power source such as a battery.

The preceding discussion has been in the context of measuring a DC current. In other example embodiments, the current measurement system 100 may be configured to measure AC current. For example, the current measurement system 100 may be modified to be powered by harvesting energy from the current measurer 110 when measuring AC current, not shown.

The current measurement system 100, whether monitoring a DC or AC conductor, may also comprise a coulomb counter (not shown) connected to the power source 102 and the signal processor 104, with the controller 402 configured to measure the capacity of the first power source 102 based on measurements generated by the coulomb counter. In example embodiments, an analog-to-digital converter (ADC) port of the controller 402, with the addition of supporting circuitry, is connected to a positive terminal of the first power source 102 and the controller 402 is configured to measure the capacity of the first power source 102.

Figure 10:
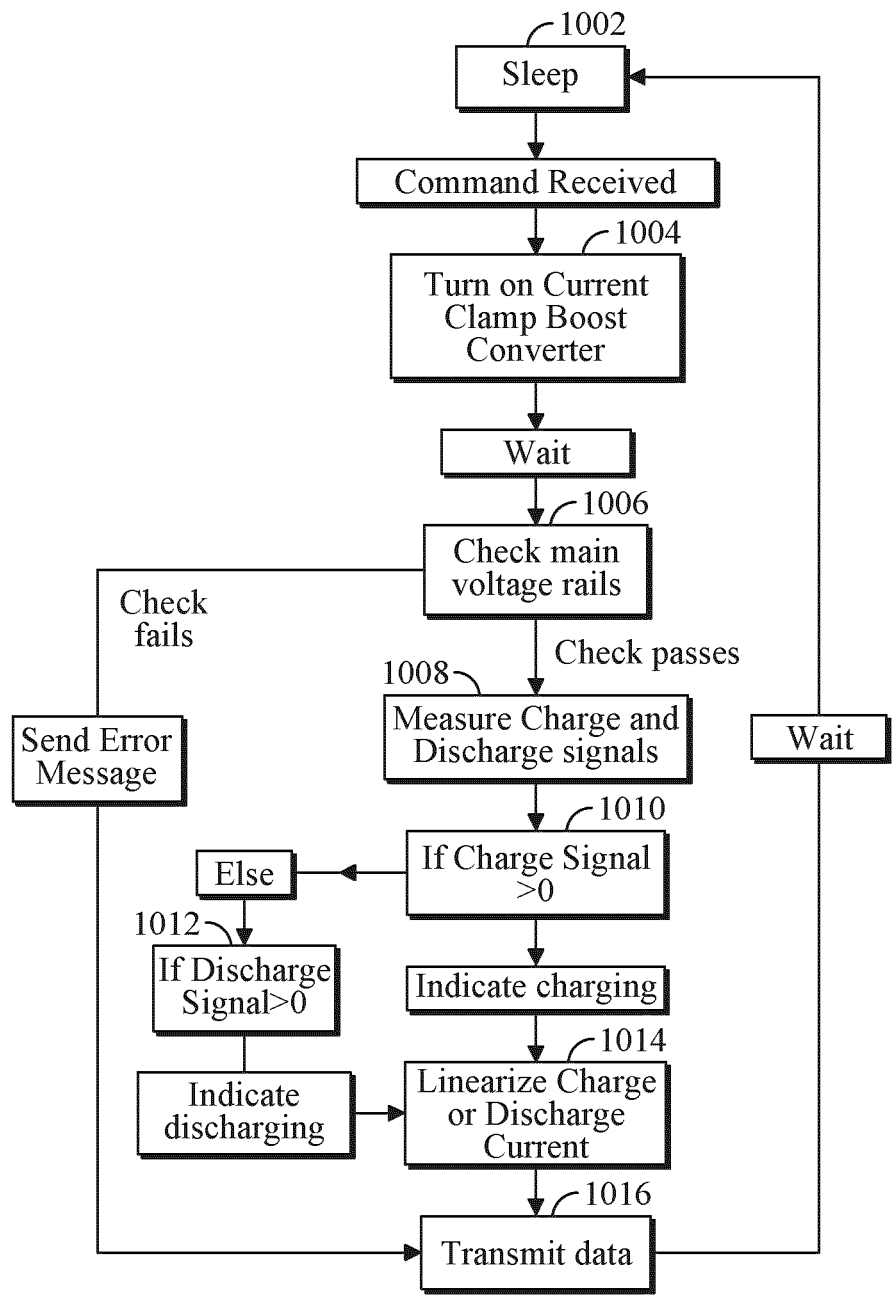
FIG. 10 illustrates a flow diagram of an example full measurement cycle using an example current measurement system.

The current measurement system 100 may be operated in a variety of manners. FIG. 10 illustrates an example operation of the current measurement system 100 through the use of a sleep mode. The method of FIG. 10 may be performed using a controller, such as controller 402 in FIGS. 4 and 9. For example, the controller 402, which may be implemented using a MCU, may be configured to rest in a sleep mode, as show in step 1002 of FIG. 10. Upon receipt of a command (e.g., an RS232 command received) from for example a remote system, the controller 402 may be configured to trigger the current measurer 110 via the boost converter 200 to take one measurement at a specified time interval, then turn off the boost converter 200 and have the controller 402 enter back to a low-current sleep state after the measurement has been obtained. The controller 402 can turn on the boost converter 200 in order to power the current measurer 110, as shown in step 1004, for the specified time interval. The specified time interval for which the controller 402 would power the boost converter 200 may be configured to be of a duration sufficient to allow an accurate reading of the output signal generated by the current measurer 110, accounting for the required settling time of current measurer 110 to steady state operation upon power up.

In example embodiments, the controller 402 may wait for the voltages received from the current measurer 110 to reach a first threshold, or a steady operating state. When a first threshold, or steady operating state, has been reached, the controller 402 proceeds to determining whether the upper supply rail and the lower supply rail are each within a second threshold. For example, the controller 402 may check whether the correct voltages are present on the main voltage rails ($V_{AMP}$ and $V_{out}$), as shown in step 1006. The controller 402 may also determine whether the second upper and lower supply rails are within the second threshold. For example, the controller 402 may check that the $V_{CLAMP}$ rail is at or about 24V and the VDC rail is at or about 5.4V. In example embodiments, the controller 402 may simply check whether the appropriate voltages are being supplied on the main voltage rails used to power the signal processor 104, for example by comparing the voltages on the voltage rails against predefined thresholds.

In example embodiments if any of the voltage rails being measured fails the check at 1006 (e.g., has a voltage outside of the predefined threshold), the controller 402 may be configured to send an error message (e.g., flag an error bit) to a remote system, or a local system via a communication interface such as but not limited to RS232.

Upon generating and transmitting an error message, the controller 402 may turn off or disable boost converter 200 (thus turning off the current measurement system 100) and enter a sleep mode or state. The controller 402 may also be configured to enter a sleep mode after sending the processed signal to the remote or local systems. In example embodiments, in order to avoid false error messages automatically triggering a maintenance request, the controller 402 may be configured to periodically sample the voltages at the voltage rails after generating and sending a first error message, and after a threshold number of error messages have been generated, a further error message of a different character may be sent. By querying the voltage rails after an error message has already been sent, the current measurement system 100 may find that the voltage rails are subsequently within a threshold, and that the initial error message is not indicative of an error at a later time when circumstances have changed.

Returning to step 1006, if the voltage signals received by the controller 402 from the current measurer 110 are within an expected range (i.e., are within the predefined thresholds), the controller 402 may be configured to measure the incoming first and second output signals (the charge and discharge signal) as shown in step 1008.

In example embodiments, the controller 402, upon measuring the incoming first and second output signals, converts the aforementioned signals from analog values to digital outputs. For example, the current measurement system may comprise an analog-to-digital converter, whether within the controller 402 or otherwise.

The controller 402 may be configured to send data packets via the communication lines discussed above, where the data packets include charge/discharge measurements. The controller 402 may generate a data packet based on the digital output. The controller 402 may determine which of the first and second outputs (charge or discharge signal) to include in the data packet being sent. For example, the controller 402 may determine which of the first and second outputs has a substantially non-zero value and include that non-zero value in the transmitted packet. The controller 402 may check both the first and second output signals (e.g., periodically) to determine which current value to incorporate into the data packet in order to efficiently limit bandwidth. In example embodiments, the first output signal is queried first, shown in step 1010, to determine whether it is not substantially non-zero, after which the second output signal is queried to determine whether it is substantially non-zero in step 1012. In example embodiments, the second output signal is queried before the first output signal, or the signals are queried simultaneously.

The controller 402 may record the substantially non-zero values in the data packet(s) in a local memory. In example embodiments, the data packets are not stored, but transmitted in real time. In example embodiments the controller 402 may be configured to include information in the data packet (e.g., a direction bit or direction flag) indicating whether the recorded signal indicates charging or discharging. For example, a direction bit may be set to "1" to indicate charging, and may be set to "0" to indicate discharging. The use of a direction bit (or other indicator of charging or discharging) may enable only one signal to be stored, instead of requiring separate signals to be stored for charging and discharging. Operating the current measurement system 100 to store only one signal may streamline processing time as only one signal will need to be linearized. In some examples, the direction bit may not be used (e.g., the charging and discharging signals are stored separately).

In step 1014, the substantially non-zero values in the data packet may be processed (e.g., linearized) by controller 402 to error correct any undesired characteristics introduced by any non-linearity of the current measurer 110. In example embodiments, the digital signal is filtered by applying one or more appropriate first order equations to remove noise from the substantially non-zero first and second output.

In step 1016, the data packet is sent over any suitable communication protocol (e.g., as a TX RS232 message). In example embodiments, the controller 402 may add any error bit value, described in relation to step 1006 above, to the processed value, or append the error bit value to the data packet, to allow a receiving system, which may be a local or remote system, to determine when the current measurement system entered an error state. The controller 402 may then send an error packet or the compromised packet with the error bit attached.

The controller 402 may (optionally after waiting for a time interval, such as 3 ms) then return to sleep at 1002.

Figure 11:
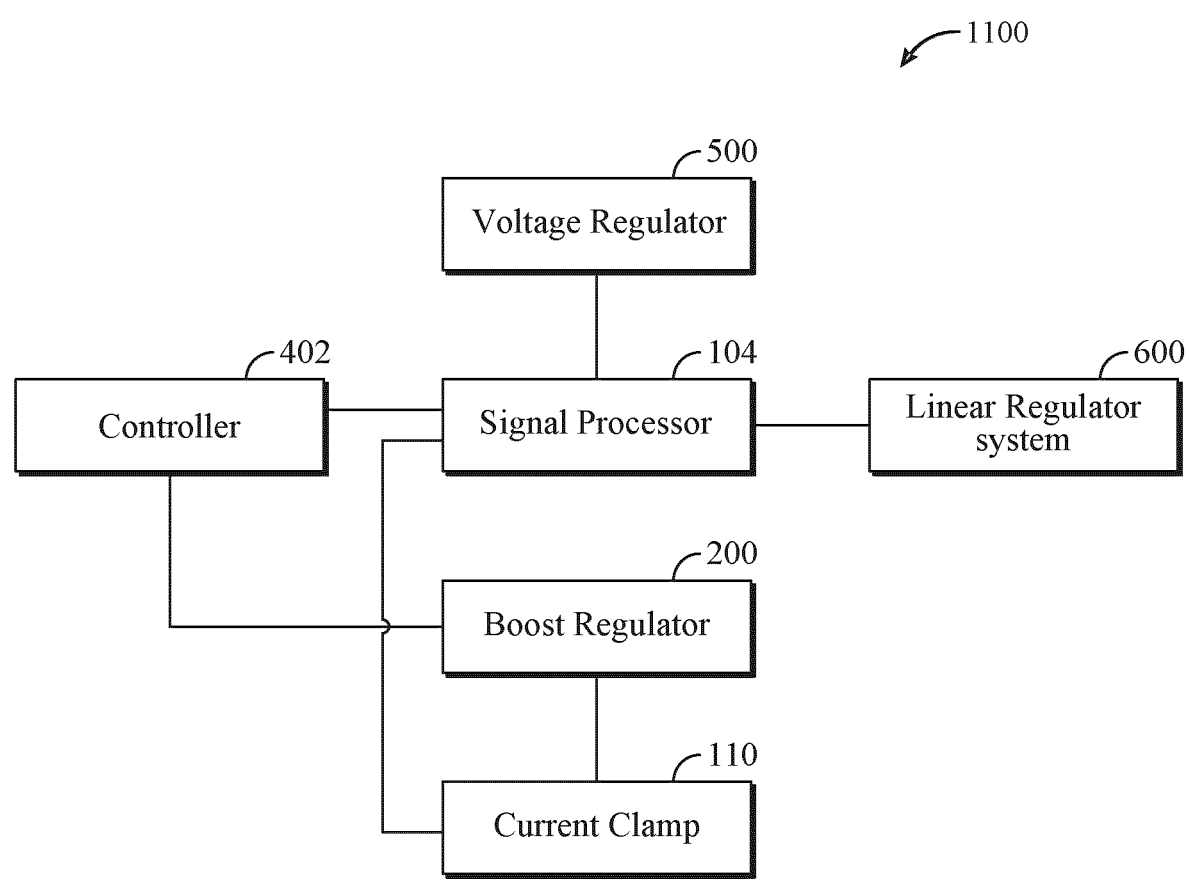
FIG. 11 illustrates an example block diagram showing interconnectivity between example circuits.

FIG. 11 is an example embodiment of a circuit configuration 1100 of a portion of current measurement system 100. In the example embodiment, controller 402 is separate from the signal processor 104. As discussed above, in other examples controller 402 may be within signal processor 104. Controller 402 is connected to boost converter 200 and signal processor 104. Controller 402 activates boost converter 200. Boost converter 200 provides the required voltage level 204 to the current measurer 110 utilizing the power sources 212 which, for example, can be used to power hall effect transducer incorporated into the current measurer 110.

Signal processor 104 may be connected to voltage regulator 500, the voltage regulator 500 providing the required voltage for positive supply rail 424. Signal processor 104 may further be connected to the linear system regulator 600, which provides a biasing voltage 426 to signal processor 104.

The system as described herein represents a current measurement system. The current measurement can be bi-directional or uni-directional. Bi-directional circuitry may be readily modified to measure current in a single direction using the same or similar techniques described above.

The processing of signals may be implemented by hardware, or by software embodied as program stored in a memory coupled with the MCU. For example, the program may comprise instruction codes that, when executed by the controller, perform the above-mentioned steps, processes and methods. The program may be contained in memory, such as read access memory (RAM), or read-only memory (ROM) and is executable by the MCU connected to the memory, or other programmable device such as, for example, an application-specific integrated circuit (ASIC).

The current measurement system described herein may minimize the invasiveness to the system under monitoring to maintain isolation between the sensor and the system. The system described herein may operate so that failure of the current measurement system does not result in failure of the system being monitored, and vice versa. The configuration of the disclosed current measurement system may thus preserve the reliability and safety of the system being monitored.

The current measurement system may reduce the power drawn from the system being monitored, which may help to maintain accuracy during low charge current measurement. The active circuitry of the disclosed current measurement system, which may require an external power source, can be managed to turn on only when current is being measured, as described above, to reduce the impact on battery capacity and accuracy of the measurement.

The current measurement system may avoid generating impedance in the charge and discharge path. Introducing impedance during current measurement can reduce the expected output voltage from the battery bank and lower system reliability by adding another failure point to the monitored system.

The current measurement system may be designed to have a small form factor and simple mounting configuration for seamless integration with existing half effect transducer sensors.

The current measurement system, including a high input impedance op-amp circuit in some example embodiments, may separate the incoming current measurer signal into forward and reverse current magnitudes without impacting the linearity of the measurement.

A current measurer signal may be linearized by applying one or more first order equations using a controller with minimum computing power to minimize power consumption.

A current measurement system as disclosed herein may enable current measurement on demand through serial interface or based on fixed interval reporting mechanism.

A current measurement system as disclosed herein may consume less than 1 mA as an average current consumption over the course of one-minute interval.

A current measurement system as disclosed herein may facilitate self-powering current detection in the case of the AC current measurer.

A current measurement system as disclosed herein may be a cost effective system that provides increased linearity over power source trickle charging, regular charging, as well as in-rush current measurement.

A current measurement system as disclosed herein may have hosted and non-hosted operating modes where the system accepts commands from a remote system or operates as a fixed interval reporting system.

A current measurement system as disclosed herein can be powered by the power source under monitoring and without loading the power source.

A current measurement system as disclosed herein may monitor the first power source 102, and may also monitor the power source voltage as well when the power source positive terminal is connected to one of the ADC ports on the controller. This may allow for fuel gauge measurements and identifying the capacity of the power source. A full coulomb counter approach may be used.

A current measurement system as disclosed herein may be configurable through a remote system where the user can set the desired reporting interval. Selectable reporting parameters may include but are not limited to: power source voltage, current, ambient temperature and humidity.

A current measurement system as disclosed herein may be configurable to manage power consumption, which may allow the system to be powered for years through inexpensive external power sources such as a coin cell battery.

A current measurement system as disclosed herein may use an emulated approach to carry floating point measurement using a non-floating point controller.

It will be appreciated that the present disclosure describes various example embodiments, and that modifications departing from the examples may be applicable within the scope of the disclosure.

The invention claimed is:

1. A current measuring system comprising:
   a current measurer, configured to generate an output signal upon sensing a current in a conductor connected to a first power source, the current measurer being connected to an input terminal of a first circuit and a second circuit;
   the first circuit and the second circuit comprising a first input and a second input connected to the input terminal, and a first output and a second output, respectively;
   the first output indicating, based on the first input, that the first power source is charging energy;
   the second output indicating, based on the second input, that the first power source is discharging energy;
   a controller connected to the first output and the second output, the controller being configured to:
      determine a first threshold signal, the first threshold signal being whichever one of the first or second output signal that is above a first signal threshold; and
      linearize the first threshold signal.

2. The current measurement system of claim 1, wherein linearizing comprises applying one or more first order equations to the first threshold signal.

3. The current measurement system of claim 1, wherein the current measurer is connected to a boost converter, the boost converter being connected to the first power source and configured to power the current measurer.

4. The current measurement system of claim 1, wherein:
   the second circuit is configured to generate the first threshold signal to a second output in response to the input signal indicating that the first power source is discharging energy; and
   the first circuit configured to generate the first threshold signal to a first output in response to the input signal indicating that the first power source is charging energy.

5. The current measurement system of claim 4, wherein the first circuit comprises:
   an inverting operational amplifier (op amp) connected to an upper supply rail and a lower supply rail, the lower supply rail being supplied at a non-negative voltage, and the op amp being connected to the first output.

6. The current measurement system of claim 5, wherein the second circuit comprises:
   a biasing circuit connected to the second input and a non-inverting op amp; and
   the non-inverting op amp being connected to a second upper supply rail and a second lower supply rail, the second lower supply rail being supplied at a non-negative reference voltage, the non-inverting op amp being connected to the second output.

7. The current measurement system of claim 6, wherein the reference voltage is supplied by a third circuit comprising a voltage regulator configured to step down the reference voltage to the output signal.

8. The current measurement system of claim 6, wherein the biasing circuit comprises a linear regulator system configured to provide the reference voltage.

9. The current measurement system of claim 1, wherein the controller is further configured to process the first threshold signal into a digital output.

10. The current measurement system of claim 1, wherein the current measurer is configured to harvest energy to power the current measuring system when measuring AC current.

11. The current measurement system of claim 1, wherein the controller has an interface to receive commands from a remote system.

12. The current measurement system of claim 1, wherein the controller has an interface to receive commands from a local system.

13. The current measurement system of claim 1, wherein the current measurer is connected to a boost converter, the boost converter being connected to a second power source and configured to power the current measurer.

14. The current measurement system of claim 1, wherein the controller is connected to the first power source.

15. The current measurement system of claim 1, wherein the controller and first power source are connected to a coulomb counter, the coulomb counter being configured to measure the capacity of the first power source.

16. The current measurement system of claim 1 wherein the controller is a non-floating point controller configured to emulate and carry floating point measurements.

17. The current measurement system of claim 1, wherein the first signal threshold is zero and the current measurer is a current clamp comprising a hall effect transducer.

18. A method of operating the current measurement system of claim 6 comprising:
   determining, by the controller that voltages of the first and second output signals are each within a first threshold;
   determining, by the controller, that the upper supply rail and the lower supply rail are each within a second threshold;
   determining, by the controller, that the second upper supply rail and the second lower supply rail, are each within the second threshold;
   processing the first and second output signals into the controller;

determining a first threshold signal, the first threshold signal being whichever one of the first or the second output signal that is above a first signal threshold;

linearizing the first threshold signal;

converting the linearized first threshold signal into a digital output; and generating a data packet containing the digital output.

19. The method of claim 18, wherein linearizing comprises processing the first threshold signal using first order equations to reduce any non-linearity in the signal.

20. The method of claim 18, further comprising sending the data packet over a communication protocol to a remote device.

21. The method of claim 18, wherein the controller is configured to enable operation of the current measurement system in response to a remote system signal.

22. The method of claim 18, wherein the controller is configured to enable operation of the current measurement system at a pre-determined interval.

23. The method of claim 21, further comprising entering the current measurement system into a sleep mode after generating the data packet.

24. The method of claim 18, wherein in response to determining that at least one of the first and second output signals is outside of the first threshold, sending an error signal.

25. The method of claim 18, wherein in response to determining at least one of the upper supply rail, the second upper supply rail, the lower supply rail, or the second lower supply rail is outside the second threshold, sending an error signal.

26. The method of claim 18, wherein the first threshold is zero.

\* \* \* \* \*